US012781581B2

(12) United States Patent
Luo et al.

(10) Patent No.: US 12,781,581 B2
(45) Date of Patent: Nov. 3, 2026

(54) EVALUATION AND CONTROL OF INFLUX CIRCULATION DURING MANAGED PRESSURE DRILLING OPERATIONS

(71) Applicant: Halliburton Energy Services, Inc., Houston, TX (US)

(72) Inventors: Yan Luo, Carrollton, TX (US); Adan H. Herrera, Carrollton, TX (US); Muran Han, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 455 days.

(21) Appl. No.: 18/387,291

(22) Filed: Nov. 6, 2023

(65) Prior Publication Data

US 2025/0146372 A1 May 8, 2025

(51) Int. Cl.

| | |
|---|---|
| ***E21B 21/08*** | (2006.01) |
| ***E21B 44/06*** | (2006.01) |
| ***G06F 30/28*** | (2020.01) |
| *E21B 47/10* | (2012.01) |

(52) U.S. Cl.

CPC .............. *E21B 21/08* (2013.01); *E21B 44/06* (2013.01); *G06F 30/28* (2020.01); *E21B 47/10* (2013.01); *E21B 2200/20* (2020.05); *E21B 2200/22* (2020.05)

(58) Field of Classification Search

CPC .......... E21B 21/08; E21B 44/06; E21B 47/10; E21B 2200/20; E21B 2200/22; E21B 44/00; E21B 47/00; E21B 700/118; E21B 700/109; G06F 30/28

See application file for complete search history.

(56) References Cited

U.S. PATENT DOCUMENTS

| | | | |
|---|---|---|---|
| 9,784,100 | B2 | 10/2017 | Haberer et al. |
| 10,094,186 | B2 | 10/2018 | Dillard et al. |
| 10,443,328 | B2 | 10/2019 | Culen |
| 10,767,427 | B2 | 9/2020 | Johnson et al. |

(Continued)

FOREIGN PATENT DOCUMENTS

| | | | | |
|---|---|---|---|---|
| CA | 3079187 A1 * | 4/2019 | ............. | E21B 33/06 |
| GB | 2494959 A | 3/2013 | | |

(Continued)

*Primary Examiner* — Kamini S Shah
*Assistant Examiner* — Michael Tang
(74) *Attorney, Agent, or Firm* — Conley Rose, P.C.; Rodney B. Carroll

(57) ABSTRACT

Disclosed embodiments relate to MPD well drilling methods, for example allowing evaluation of whether an influx can safely be circulated out of the system. For example, a simulator can be used with parameter data from the MPD system to estimate in real time whether the influx can be circulated by the MPD system without exceeding equipment limits, and may be flexible enough to address both oil and water-based mud systems. For example, the simulator may use a multi-phase flow model to estimate the maximum pressure and maximum flowrate, which can then be compared to the equipment limits to determine whether or not the influx can be safely circulated by the MPD system. In some embodiments, the simulator can also be run iteratively to allow for optimization of the fluid circulation process. Systems and devices related to such methods are also disclosed.

20 Claims, 2 Drawing Sheets

(56) References Cited

U.S. PATENT DOCUMENTS

| | | | | |
|---|---|---|---|---|
| 10,871,762 | B2 | 12/2020 | Elyas et al. | |
| 2002/0193976 | A1* | 12/2002 | Duret | F17D 1/17 703/10 |
| 2003/0139916 | A1* | 7/2003 | Choe | E21B 41/0007 703/10 |
| 2013/0087388 | A1* | 4/2013 | Veeningen | E21B 47/10 175/48 |
| 2016/0130905 | A1* | 5/2016 | Holmes | E21B 34/16 700/282 |
| 2016/0138351 | A1* | 5/2016 | Dillard | E21B 33/128 175/25 |
| 2018/0187498 | A1 | 7/2018 | Sanchez Soto et al. | |
| 2025/0027375 | A1* | 1/2025 | Al-Nakhli | E21B 21/068 |

FOREIGN PATENT DOCUMENTS

| | | | | |
|---|---|---|---|---|
| WO | WO-2015072962 | A1 * | 5/2015 | E21B 44/00 |
| WO | WO-2015110599 | A1 * | 7/2015 | G06F 30/20 |
| WO | 2016040310 | A1 | 3/2016 | |
| WO | WO-2016040272 | A1 * | 3/2016 | E21B 21/08 |
| WO | WO-2024006478 | A2 * | 1/2024 | E21B 21/08 |

* cited by examiner

EVALUATION AND CONTROL OF INFLUX CIRCULATION DURING MANAGED PRESSURE DRILLING OPERATIONS

FIELD

The present disclosure relates generally to methods and equipment used in operations which may be performed in conjunction with drilling a subterranean well, such as an oil or gas well, and more particularly to managed pressure drilling operations and associated equipment and techniques to better evaluate and address influxes.

BACKGROUND

In drilling operations, controlling the flow of fluids in the well can be important, both for more effective operation of the well and for safety. For example, when drilling a well in a hydrocarbon rich-formation, if wellbore pressure (e.g. bottom hole pressure-BHP) is not maintained at a desired level during drilling operations, unwanted effects can lead to undesired results. For example, if wellbore pressure is not effectively controlled, there may be unwanted influx of formation fluids into the wellbore or excess loss of drilling fluid into the formation surrounding the wellbore. Influx (also known as "kick") is the flow of formation fluids into the wellbore during a drilling operation, while fluid loss can occur when drilling fluid in the wellbore enters the formation.

An influx into the wellbore can disrupt normal drilling operations and, if left unchecked, can lead to hazardous conditions. For example, if an influx is not detected and controlled effectively, the influx can escalate into an uncontrolled flow of formation fluids to the surface through the well (sometimes called a "blow-out"), which could result in operational delays in the drilling operation (e.g. non-productive time), damage to the drilling equipment, and/or even injury to personnel. The drilling system may be designed to safely handle smaller influxes, but larger influxes can overwhelm such a system, raising the risk of blowout. Typically, influx may be controlled by effectively managing the pressure within the well. For example, wellbore pressure may be maintained at a desired level during drilling operations in order to prevent significant influx. However, when there are influxes, the system needs to be able to quickly evaluate whether the system can effectively handle the influx, and if so, to safely circulate the influx out of the system.

BRIEF DESCRIPTION OF THE DRAWINGS

Embodiments of the disclosure may be better understood by referencing the accompanying drawings.

DESCRIPTION

Figure 1:
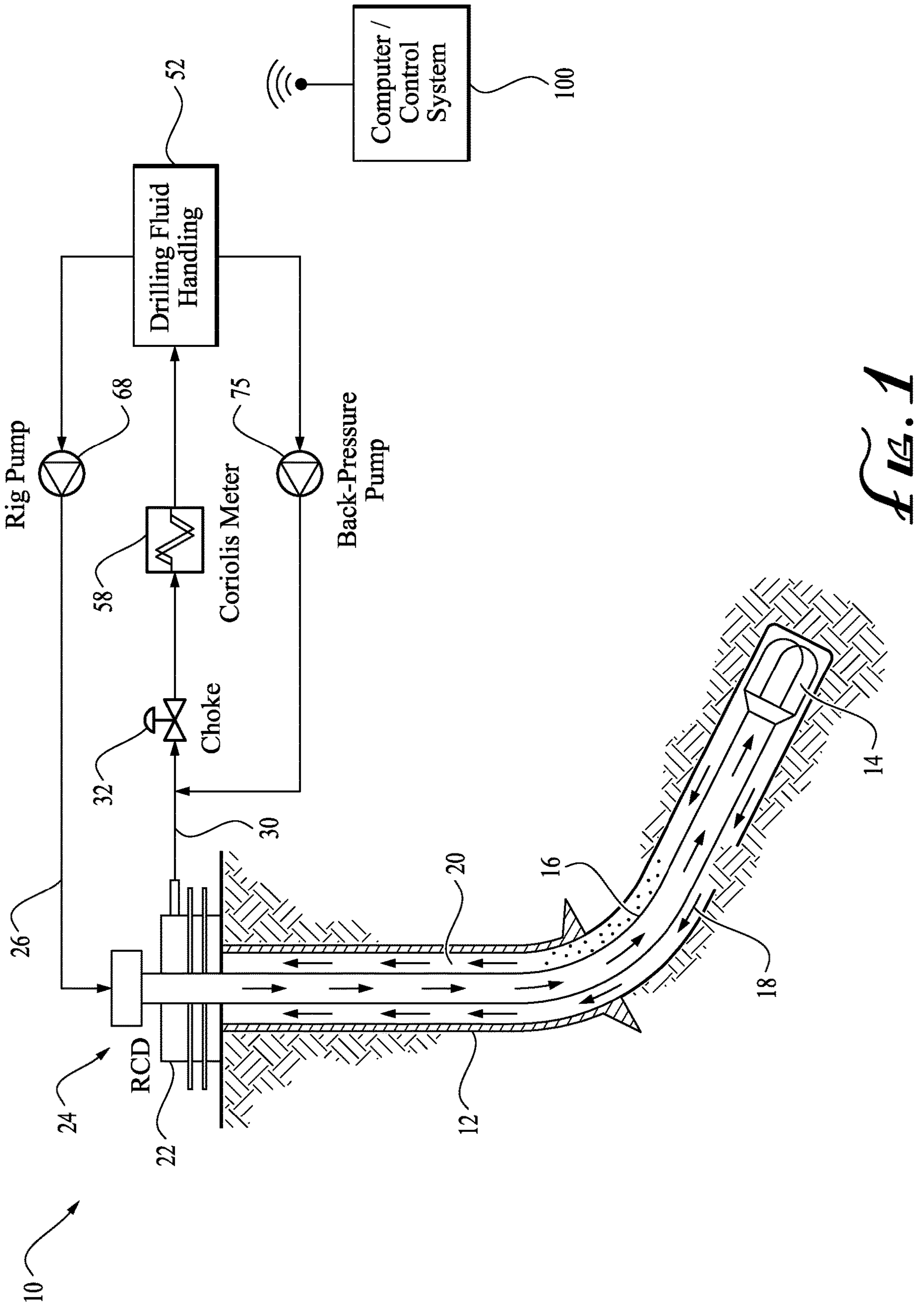
FIG. 1 illustrates schematically an exemplary MPD drilling system, according to an embodiment of the disclosure.

The description that follows includes example systems, methods, techniques, and program flows that embody aspects of the disclosure. However, it is understood that this disclosure may be practiced without these specific details.

For brevity, well-known steps, protocols, structures, and techniques have not been shown in detail in order not to obfuscate the description.

As used herein the terms "uphole", "upwell", "above", "top", and the like refer directionally in a wellbore towards the surface, while the terms "downhole", "downwell", "below", "bottom", and the like refer directionally in a wellbore towards the toe of the wellbore (e.g. the end of the wellbore distally away from the surface), as persons of skill will understand. Orientation terms "upstream" and "downstream" are defined relative to the direction of flow of fluid in the wellbore. "Upstream" is directed counter to the direction of flow of well fluid, while "downstream" is directed in the direction of flow of well fluid, as persons of skill will understand.

During drilling operations, it is crucial to maintain the bottom hole pressure (BHP) in the operational window at any depth in the open-hole section of the wellbore. If the BHP falls below the pore pressure of the formation, it can lead to the influx of formation fluids into the wellbore. By contrast, a loss can occur when the BHP is over the fracture pressure, with drilling fluid in the wellbore being lost to the formation, which can have detrimental effects. An uncontrolled influx can trigger a "blow-out", which has potentially catastrophic consequences.

Managed pressure drilling (MPD) is a type of drilling that uses a closed system to control the annular pressure profile of the wellbore during the drilling operation. For example, an exemplary MPD system may use a rotating control device (RCD), an automatic choke, and one or more mud pumps to create a closed-loop system with the drillstring and the well. MPD operators can use the RCD, choke, and pump to control annulus pressure in the well, for example to maintain an approximately constant BHP during drilling operations.

MPD systems can enable precise control of the annular pressure profile in the wellbore, allowing wells to be drilled more safely in formations with narrow pressure margins (e.g. when the margin between the pore pressure and the fracture pressure is relatively small). Exemplary MPD systems are typically closed-loop drilling systems, and may use an RCD, a choke manifold, and a pressurizable mud-return system to control wellbore pressure during drilling. Exemplary pressurizable mud-return systems may include a mud pump and standpipe line. MPD systems may also include one or more flow meter (such as a Coriolis meter) and a backpressure pump. MPD typically relies on the choke manifold (e.g. one or more choke devices) to apply back pressure on the annular side, to maintain the BHP approximately constant throughout the drilling operation. Additionally, the flow meter may enable early influx detection by constant monitoring of the difference between the return flow (e.g. the flow-out of the annulus) and the flow-in (e.g. flow into the drillstring). For example, a Coriolis flow meter can be used, due to its accuracy. Combined with immediate adjustment of back pressure by manipulating the choke (and/or using the backpressure pump if needed), the MPD system can allow small and medium size influxes to be effectively neutralized for safe circulation out of the well without needing a conventional shut-in process. However, early detection and timely evaluation of the influx can be important to determine the appropriate action in order to effectively address/manage the influx.

An exemplary well drilling system 10 is illustrated in FIG. 1. However, it should be clearly understood that the MPD system 10 and associated methods are merely examples of an application of the principles of this disclosure in practice, and a wide variety of other examples are possible. Therefore, the scope of this disclosure is not limited to the details of the system 10 and methods described herein and/or depicted in the drawings. For example, while the drilling system 10 of FIG. 1 may include a wellbore 12 and a drillstring 16 disposed in the wellbore 12, in some embodiments, the system 10 may include equipment that may have various characteristics and features associated with an offshore platform, a land drilling rig, a drill ship, semi-submersibles, and/or drilling barges. Various types of drilling equipment such as the rotating control device (RCD) 22, blow out preventer (BOP), one or more mud pumps 68, one or more mud tanks, one or more gas separator, choke manifold 32, flow meters (such as Coriolis meter 58), connecting tubing/pipes (for example configured to provide fluid communication between various equipment/elements of the MPD system 10 and configured to withstand typical operating pressures for such as system), and/or any other suitable equipment may be located on the well surface and/or at the well site.

As shown in FIG. 1, for example, a wellbore 12 may be drilled by rotating a drill bit 14 on an end of a drillstring 16. Drilling fluid 18, commonly known as mud, can be circulated downward through the drillstring 16, out the drill bit 14 and upward through an annulus 20 formed between the drillstring 16 and the wellbore 12, in order to cool the drill bit 14, lubricate the drillstring 16, remove cuttings from the drilling process, and provide a measure of bottom hole pressure control. In embodiments, a non-return valve (typically a flapper-type check valve) can prevent flow of the drilling fluid 18 upward through the drillstring 16 (e.g., when connections are being made in the drillstring), for example with the drillstring being configured to only allow fluid flow downhole through the drillstring.

In the system 10, additional control over the wellbore pressure can be obtained by closing off the annulus 20 (e.g., isolating it from communication with the atmosphere and enabling the annulus 20 to be pressurized at or near the surface), for example using a rotating control device 22 (RCD). The RCD 22 seals about the exterior of the drillstring 16, for example above a wellhead 24, isolating the annular space (e.g. to allow the annulus 20 to be pressurized) while allowing the drillstring 16 to rotate and fluid to circulate (e.g. within the drillstring 16 and/or in the annular space (e.g. annulus 20) between the drillstring 16 and the surface/walls of the wellbore 12). The drillstring 16 can extend out of the wellbore through the RCD 22 for connection to, for example, a rotary table, a standpipe line 26 (e.g. configured to provide pressurized mud to the drillstring, e.g. from a mud pump 68), a kelly, a top drive and/or other conventional drilling equipment.

In embodiments, the RCD 22 may be in fluid communication with a choke manifold 32. The drilling fluid 18 exits the wellhead 24 (e.g. via a wing valve in communication with the annulus 20 below the RCD 22), and then flows through mud return line 30 to the choke manifold 32 (typically located in proximity to the RCD). In some embodiments, the choke manifold 32 may include a plurality of chokes, such as a series of redundant chokes in which only one might be used at a time. For example, a plurality of the chokes of the choke manifold 32 may be configured for different flowrates therethrough (e.g. with different restriction therethrough). In some embodiments, the choke manifold 32 may comprise one or more adjustable choke (e.g. in which the amount of restriction is adjustable). In some embodiments, the choke manifold 32 may comprise an automatic choke, for example having a valve or series of valves operable to adjust the pressure of drilling fluid 18 in the well. Adjustments to well pressure may be based on adjusting the choke manifold 32, for example opening and closing one or more valves in such an automatic choke, and the one or more valves can be of any variety of styles, sizes and pressure ratings. In embodiments, the choke manifold 32 may be controlled by signals from a control system 100, control unit, or any other suitable control mechanism. For example, an automatic choke may be operated remotely via hydraulic actuators or operated via any other suitable method. Backpressure can be applied to the annulus 20 and managed by variably restricting flow of the fluid 18 through the operative choke(s) of the choke manifold 32.

In other examples, flow control devices other than chokes may be used (e.g. in the choke manifold) for applying backpressure to the annulus 20. The flow control device can be used to restrict flow or divert flow, so that the backpressure applied to the annulus 20 is regulated.

In the example of FIG. 1, the greater the restriction to flow through the choke manifold 32, the greater the backpressure (e.g. also termed surface backpressure or "SBP") applied to the annulus 20. Thus, downhole pressure (e.g., pressure at the bottom of the wellbore 12, pressure at a downhole casing shoe, pressure at a particular formation or zone, etc.) can be conveniently regulated by varying the backpressure applied to the annulus 20. Typically, a control system 100 (which may be computerized and/or may operate based on software, for example) may manage the pressure by monitoring pressure and/or other parameters using one or more sensors and adjusting backpressure (for example, via the choke manifold 32). In some embodiments, a hydraulics model can be used to determine a pressure to be applied to the annulus 20 at or near the surface which will result in a desired downhole pressure, so that an operator (which may be an automated control system in some instances) can readily determine how to regulate the pressure applied to the annulus 20 at or near the surface (which can be conveniently measured) in order to obtain the desired downhole pressure.

In FIG. 1, the choke manifold 32 is in fluid communication with a drilling fluid handling system 52. The MPD system 10 of FIG. 1 is configured so that drilling fluid 18 from the wellbore 12 can flow through the choke manifold 32 to the drilling fluid handling system 52, which may for example comprise one or more mud pit/mud tank and/or one or more mud gas separator. In some embodiments, the gas separator may be a two-phase or a three-phase separator. The mud pits may be used to store drilling fluid 18 circulating through the system 10, for example providing temporary storage of drilling fluid (for example sufficient to handle a small influx). In embodiments, mud pits may comprise one or more open-top containers, for example made of steel or other suitable material. The amount of drilling fluid in the mud pits may be monitored and communicated to personnel, the control system 100, or other suitable control mechanism. Additionally, in some embodiments mud pits may include temperature sensors, pressure sensors, filters, alarms, flow rate meters, and/or any other equipment suitable for monitoring, maintaining, and controlling drilling fluid in the mud pits.

In addition to being in fluid communication with the choke manifold 32, the drilling fluid handling system 52 of FIG. 1 is also in fluid communication with one or more mud pumps 68. For example, from the drilling fluid handling system 52, drilling fluid 18 may be directed either to the rig mud pump 68 (e.g. to be pressurized for insertion back into the drillstring) or (for example if needed to control fluid flow) to a backpressure pump 75, which then may pump the drilling fluid back into the mud return line 30 (e.g. at a location between the wellhead 24 and the choke manifold 32). For example, the backpressure pump 75 may be used to provide additional backpressure (SBP), for example if the choke manifold 32 alone cannot generate the required backpressure for the system.

The drilling fluid 18 is pumped through the standpipe line 26 and into the interior of the drillstring 16 (which passes into the wellbore 12 through the RCD 22) by the rig mud pump 68 (which is in fluid communication with the drilling fluid handling system 52 and the drillstring 16). In FIG. 1, the rig mud pump 68 receives the fluid 18 from the drilling fluid handling system 52 and flows it (for example via a standpipe manifold) to the standpipe line 26. The fluid 18 then can circulate downward through the drillstring 16, upward through the annulus 20, through the mud return line 30, through the choke manifold 32, and then to the drilling fluid handling system 52 for conditioning (e.g. using the gas separator) and recirculation (e.g. via the mud pump 68).

Mud pump 68 may include one or more pumps in various configurations. For example, mud pump 68 may include a plurality of pumps configured in parallel or may be configured such that one pump is designated as an operating pump, while one or more additional pumps are designated as standby pumps. For example, the operating pump normally pumps the fluid, while the standby pump remains in standby in case the operating pump fails or another system condition requires the use of the standby pump. In alternate embodiments, mud pump 68 may include a plurality of pumps configured in series or a single pump. In embodiments, the mud pump 68 may additionally include temperature sensors, flow rate meters, pressure sensors, filters, alarms, or any other suitable components to allow for monitoring and control of the mud pump 68.

The mud pump 68 may comprise one or more variable speed pump, thus allowing variable flow and/or pressure, or may comprise one or more fixed-speed pumps (e.g. with a manifold controlling flow between a plurality of fixed-speed pumps). In embodiments, the mud pump 68 may comprise one or more pumps configured to maintain a consistent flow, such as gallons per minute (gpm or gal/min). In embodiments, the mud pump 68 may comprise one or more particular horsepower (hp) pumps. Multiple flow rates may be identified for any drilling configuration or design, and the mud pump 68 may be configured to provide such flow rates.

While the back-pressure pump 75 is shown as a separate pump in FIG. 1 which is in fluid communication with the mud return line 30 (e.g. in fluid communication between the drilling fluid handling system 52 and the mud return line 30), in some embodiments, the mud pump 68 may include or be configured to serve as the annular backpressure pump (e.g. configured to provide active pressure to annulus 20, for example by pumping fluid into the mud return line 30 between the RCD 22 and the choke manifold 32).

In FIG. 1, fluid flow rate may be measured in one or more locations throughout the system 10, for example between the choke manifold 32 and the drilling fluid handling system 52. In embodiments, fluid flow rate may be measured both going into (e.g. flow-in rate, in the standpipe line 26) and coming out (e.g. flow-out rate, in the mud return line 30) of the wellbore. In embodiments, a discrepancy between the flow rate of the drilling fluid going into the wellbore and the flow rate of the drilling fluid coming out of the wellbore may be indicative of influx.

By way of example, fluid flow rate may be measured by a flow meter (e.g. configured to measure the flow rate of fluid at a location within the system), such as Coriolis meter 58. In some instances, the Coriolis meter 58 may be configured to measure the flow rate of fluid out of the well (e.g. in the mud return line 30), and the fluid flow rate into the well (e.g. through the standpipe line 26) may be measured (e.g. by a flow meter) or calculated (e.g. based on counting pump strokes of the mud pump 68, for example). Additional measuring may occur in the system in some embodiments, for example measuring the pressure (since an unexpected increase in annular pressure can be indicative of influx) at one or more location within the system 10 (e.g. including SBP), density of the fluid (e.g. at one or more location in the system 10), viscosity of the fluid (e.g. at one or more locations in the system 10), drillstring velocity and/or depth (e.g. relative to the wellbore), choke position (e.g. through which the fluid is currently flowing), mud pit volume (since unexpected gain could be indicative of influx), mud gas (since the gas content of the mud return can help detect influxes), and/or temperature (e.g. at one or more location in the system 10).

In embodiments, pressure applied to the annulus 20 can be measured at or near the surface via one or more pressure sensors, which may be in communication with the annulus 20. For example, pressure may be sensed below the RCD 22, but above a blowout preventer (BOP) stack. Pressure may be sensed in the wellhead below the BOP stack. Pressure may be sensed in the mud return line 30, for example upstream of the choke manifold 32. Pressure may be sensed between the choke manifold 32 and the drilling fluid handling system 52.

Another pressure sensor may sense pressure in the standpipe line 26—e.g. standpipe pressure (SPP). Pressure can also be sensed downstream of the choke manifold 32, but upstream of a separator, shaker, and/or mud pit. Additional sensors can include temperature sensors, one or more Coriolis flowmeter, and/or other flowmeters. For example, flowmeters may be used to detect the fluid flow rate in the mud return line (e.g. flow-out rate) and/or in the standpipe line 26 (e.g. flow-in rate). Sensors may be configured to measure density and/or viscosity of the fluid at one or more location within the system 10. Sensors may be configured to detect choke position (e.g. with respect to the choke manifold 32). Sensors may be configured to detect velocity, inclination, and/or depth of the drillstring 16 (e.g. movement of the drill bit 14 in the wellbore 12). Additionally, sensors may be configured to detect and/or provide the measurements to the control system 100 necessary to calculate/estimate influx volume, duration, and/or location.

The various sensors described herein may not all be required, for example with one or more of the sensors being optional. For example, the system 10 could include only one or two flowmeters. However, input from all available sensors can be useful to a hydraulics model and/or a well simulation (which may be used by the control system 100) and/or to the control system 100 in determining what pressure should be applied to the annulus 20 during the drilling operation.

Other sensor types may be used, if desired. For example, it is not necessary for any particular flowmeter to be a Coriolis flowmeter, and other types of flowmeters, such as a turbine flowmeter, acoustic flowmeter, or another type of flowmeter, could be used instead.

In addition, in embodiments the drillstring 16 may include its own sensors, for example, to directly measure downhole pressure. Such sensors may be of the type known to those skilled in the art as pressure while drilling (PWD), measurement while drilling (MWD) and/or logging while drilling (LWD). These drillstring sensor systems may provide pressure measurement, and may also provide temperature measurement, detection of drillstring characteristics (such as vibration, weight on bit, stick-slip, drillstring velocity, drillstring depth, etc.), formation characteristics (such as resistivity, density, etc.), flow characteristics (such as flow rate of fluid in the drillstring 16 and/or flow rate of fluid in the annulus 20 outside the drillstring 16), and/or other measurements. Various forms of wired or wireless telemetry (acoustic, pressure pulse, electromagnetic, etc.) may be used to transmit the downhole sensor measurements to the surface (e.g. to the control system 100).

Additional sensors could be included in the system 10, if desired. For example, another flowmeter could be used to measure the rate of flow of the fluid 18 exiting the wellhead 24, another Coriolis flowmeter could be interconnected directly upstream or downstream of a rig mud pump 68, etc.

Fewer sensors could be included in the system 10, if desired. For example, the output of the rig mud pump 68 (e.g. the flow rate of fluid into the drillstring (flow-in rate) from the standpipe line 26) could be determined indirectly, for example by counting pump strokes of the mud pump 68 and calculating flow rate therefrom (e.g. based on pump stroke count and pump efficiency), instead of by using a flowmeter for direct measurement.

As shown in FIG. 1, the MPD system 100 may include a control system 100. The control system 100, which is typically a computerized system (for example having one or more processor), may be communicatively coupled to any component of MPD system 10 and configured to control, monitor/measure, maintain, or perform any other suitable function within the MPD system 10. While the control system 100 is shown as being wirelessly coupled in FIG. 1, in other embodiments the control system 100 may have wired connections. Control system 100 may include any instrumentality or aggregation of instrumentalities operable to compute, classify, process, transmit, receive, store, display, record, or utilize any form of information, intelligence, signal, or data. For example, control system 100 may include one or more personal computer, processor, storage device, server, and/or any other suitable device, and may vary in size, shape, performance, functionality, and price. Control system 100 may include random access memory (RAM), one or more processing resources, such as a central processing unit (CPU) or hardware or software control logic, and/or other types of volatile or non-volatile memory. Additional components of control system 100 may include one or more disk drives, one or more network ports for communicating with external devices, one or more input/output (I/O) devices, such as a keyboard, a mouse, or a video display. Control system 100 may be configured to permit communication over any type of network, such as a wireless network, a local area network (LAN), or a wide area network (WAN) such as the Internet. Furthermore, control system 100 may be located in any suitable enclosure, and may be located on the well surface, on a ship, on shore, or in any other suitable location, typically in proximity to the well.

Typically, the system (e.g. control system 100) is configured to try to detect any influx and, if possible, to safely circulate a detected influx out of the closed-system, while maintaining well control. For example, the choke manifold 32 and/or backpressure pump 75 can be used to adjust backpressure (e.g. based on measured values and/or effective modeling and control), to maintain adequate wellbore pressure (e.g. above the pore pressure of the formation, but below fracture pressure). The control system 100 can also estimate the size and/or duration of the influx (e.g. based on sensed parameters), since knowing the size and/or duration of the influx can help evaluate the proper techniques to control the influx and the well. If the influx is too large (e.g. beyond the circulation capacity of the MPD system 10), then shut-in may be initiated; but if the influx is sufficiently small, then shut-in may be avoided. In some instances, the influx (e.g. which is sufficiently small) can be circulated out of the system 10, for example by dynamically adjusting the backpressure as the influx is circulated out of the system 10. Once the influx has been addressed, drilling can resume (since drilling is typically halted upon detecting an influx), perhaps with modifications to the system 10 based on the influx.

In some embodiments, the MPD system 10 may be configured to detect influxes in real-time, for example by monitoring various parameters of the MPD system 10. In some embodiments, the system/method for detecting influx can monitor the volume gain between flow-in and flow-out, and the influx event can be confirmed by checking standpipe pressure (e.g. if SPP is increasing) and density (e.g. if density is not decreasing). In other embodiments, the system/method for detecting influx can comprise calculating the flow rate difference (DeltaFR) between flow-out rate and flow-in rate (for example, which may take into account the baseline offset, if any), calculating the slope of DeltaFR (e.g. with respect to time, where DeltaFR may equal (Flow-Out−Flow-In)−(baseFO−baseFI)), and comparing the slope to a detection threshold; and in some embodiments confirming the influx may comprise, responsive to detection of a possible influx, calculating the size of the influx, for example based on the volume gain between flow-in rate and flow-out rate, and comparing the size of the influx to a detection sensitivity (e.g. confirmation volume). These and other approaches/systems for detecting (and confirming) the presence of an influx are within the scope of this disclosure.

If an influx is detected, the MPD system 10 typically will automatically adjust the surface back pressure (SBP) to control the influx and prevent it from escalating into a more serious problem (such as blowout). Once the influx is under control, evaluation can determine if it is safe to circulate the influx within (e.g. out of) the MPD system 10, for example without exceeding the pressure and flow rate limits of equipment in the MPD system 10. If the limits will be exceeded, the well should be shut-in to allow time for further evaluation of the situation and implementation of appropriate measures to control the influx and to prevent further problems.

Conventionally, the evaluation to determine if it is safe to circulate the influx has used a single-bubble approach (e.g. used an Influx Management Envelope (IME) tool based on the single-bubble approach). However, there may be issues with the single-bubble approach, such that an improved evaluation technique may be useful in at least some circumstances. For example, the single-bubble approach may provide a quite conservative evaluation, which may increase non-productive time unnecessarily. Single-bubble approach may disregard gas dissolution and influx dispersion, which may reduce accuracy (e.g. which may lead to conservative evaluation). Single-bubble approach cannot calculate liquid and gas flow rates. Single-bubble approach may only be effective for water-based mud (WBM) systems, and may not be effective for oil-based mud (OBM) systems. Further, conventional evaluation approaches may be time-consuming, for example taking approximately half an hour to provide results, and the results typically would be used by human operators for decision-making (e.g. potentially introducing human error). The evaluation techniques disclosed herein may address one or more of these deficiencies in the evaluation process by the conventional single-bubble approach, providing improved evaluation and circulation of influxes in the MPD system 10.

Figure 2:
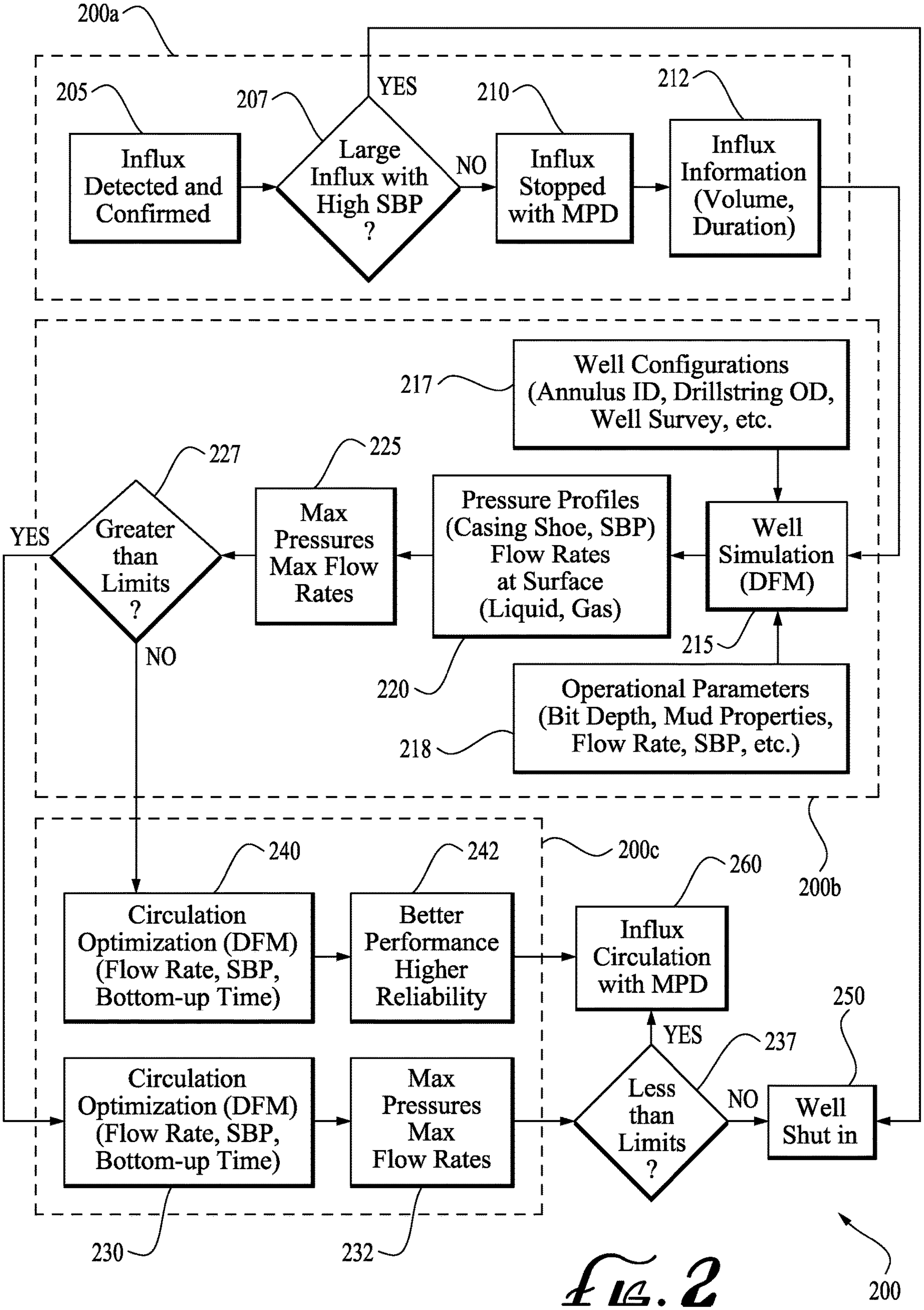
FIG. 2 illustrates schematically an exemplary method and system for evaluating whether influx can be circulated effectively, for example in the MPD system of FIG. 1, according to an embodiment of the disclosure.

For example, FIG. 2 illustrates an exemplary method (e.g. used by the control system 100) to evaluate and/or mitigate influx within an exemplary MPD system 10, which may be configured to address one or more of these concerns/deficiencies. For example, FIG. 2 illustrates a flow chart of an exemplary method for evaluating an influx to determine if it may safely be circulated out of the MPD system 10, in accordance with some embodiments of the present disclosure. For illustrative purposes, the method of FIG. 2 may be described with respect to the MPD system 10 of FIG. 1; however, the method may be used for well control when an influx is encountered in any appropriate drilling system.

The steps of this exemplary method can be performed by a user, electronic or optical circuits, various computer programs, models, or any combination thereof, configured to process drilling data. For example, the method may be operated by control system 100. The programs, simulators, and models may include instructions stored on a non-transitory computer-readable medium and operable to perform, when executed, one or more of the steps described herein. The computer-readable media can include any system, apparatus, or device configured to store and retrieve programs or instructions such as a hard disk drive, a compact disc, flash memory, or any other suitable device. The programs and models may be configured to direct a processor or other suitable unit to retrieve and execute the instructions from the computer readable media. Collectively, the user, circuits, or computer programs and models used to process the evaluation method (e.g. using a simulator) may be referred to as a control system and/or operator. For example, the control system 100 may be similar to that described with respect to FIG. 1, and may be located at the well site. In some embodiments, the control system 100 may be located elsewhere, and may receive information detected and/or stored during the drilling operations and/or send control signals to the MPD system 10 during drilling operations.

As illustrated in FIG. 2, an exemplary method for evaluating an MPD system 10 regarding circulation of an influx may begin with detecting and confirming the presence of an influx in the MPD system 10 (see block 205). Typically, in response to identifying an influx, drilling may be stopped. Detecting and confirming the influx typically results in the control system 100 being able to estimate the size (e.g. volume) and duration of the influx. If the influx is sufficiently large (e.g. over a pre-set amount that the MPD system 10 is configured to handle) and the SBP is sufficiently high (e.g. which may limit options for mitigating the influx), then well shut-in may be advisable and/or required, even without further evaluation (see decision block 207). In some embodiments, an alarm may be activated and/or shut-in may be initiated (for example automatically in some embodiments) in the event that the influx is too large to safely be circulated (see block 250). If the influx is not so large and/or the SBP is not so high as to require immediately initiating shut-in procedure, then the influx may be neutralized (see block 210). For example, the choke manifold 32 and/or backpressure pump 75 may be used to provide sufficient SBP to neutralize the influx within the MPD system 10.

The data from the MPD system 10 relating to neutralizing the influx (e.g. the influx volume and influx duration—see block 212) may be used within a well simulator (see block 215), which may for example run on the control system 100 (e.g. the processor). Additionally, the well simulator (e.g. block 215) may receive data regarding the well configuration (e.g. annulus inner diameter, drillstring outer diameter, and well survey data such as well temperature and well inclination) (see block 217) and the operational parameters of the MPD system 10 (e.g. drill bit depth, mud properties such as type of mud, mud density, and mud viscosity, flow rate, and SBP) (see block 218). In some embodiments, one or more sensors may monitor one or more parameters associated with drilling the wellbore 12 and provide data regarding the parameters to the control system 100.

So, responsive to detection (and typically confirmation) of an influx in the MPD system 10, the control unit 100 may receive data regarding the size (e.g. volume) and duration of the detected influx; receive data regarding one or more operational parameter of the MPD system 10 and/or the well configuration; use a simulator to estimate (e.g. via calculation) a maximum pressure and maximum gas/liquid flowrate for the MPD system 10 based on current conditions in the MPD system 10 (e.g. the received data); and compare the maximum pressure and maximum flowrate to equipment limits of the MPD system 10, with the influx capable of being circulated out of the MPD system 10 if the maximum pressure and maximum flowrate are both less than the equipment limits. In some embodiments, the equipment limit relating to pressure may include the pressure limit of a casing shoe of the well and/or the pressure limit of the RCD 22 of the MPD system 10. In some embodiment, the equipment limit relating to flowrate may include the flowrate limit determined by the capacity of the gas separator of the MPD system 10.

In some embodiments, the simulator (see block 215) may use a multi-phase flow model (such as a two-phase flow model), which may be a transient multi-phase flow model in some embodiments. For example, the simulator may use a Drift Flux Model (DFM). In some embodiments, the model used by the simulator may consider mass conservation of the gas and liquid phases separately (e.g. using a first mass conservation equation for liquid and a second mass conservation equation for gas), and interactions between the two phases may be accounted for (e.g. using a mixture momentum equation in addition to the two mass conservation equations, for example counting interactions between the two phases with a mixture momentum equation). In some embodiments, the model may calculate liquid and gas flowrates. In some embodiments, the model may consider (e.g. take into account) gas solubility. In some embodiments, the simulator may be effective for both water-based mud (WBM) and oil-based mud (OBM), for example with the appropriate model being selected based on mud type within the MPD system 10. Consider for example the following model illustration:

$$\overset{WBM}{\frac{\partial}{\partial t}\begin{pmatrix}\rho_l\alpha_l\\ \rho_g\alpha_g\\ \rho_l\alpha_l\theta_l+\rho_g\alpha_g\theta_g\end{pmatrix}+\frac{\partial}{\partial x}\begin{pmatrix}\rho_l\alpha_l\theta_l\\ \rho_g\alpha_g\theta_g\\ \rho_l\alpha_l\theta_l^2+\rho_g\alpha_g\theta_g^2+p\end{pmatrix}=\begin{pmatrix}0\\ 0\\ -F_G-F_f\end{pmatrix}}$$

$$\downarrow$$

$$\overset{OBM}{\frac{\partial}{\partial t}\begin{pmatrix}\rho_l\alpha_l\\ \rho_g\alpha_g\\ \rho_l\alpha_l\theta_l+\rho_g\alpha_g\theta_g\end{pmatrix}+\frac{\partial}{\partial x}\begin{pmatrix}\rho_l\alpha_l\theta_l\\ \rho_g\alpha_g\theta_g\\ \rho_l\alpha_l\theta_l^2+\rho_g\alpha_g\theta_g^2+p\end{pmatrix}=\begin{pmatrix}\boxed{\begin{matrix}\dot{m}\\ -\dot{m}\end{matrix}}\\ -F_G-F_f\end{pmatrix}}$$

$$\uparrow$$

introduce $\dot{m}$−mass rate of gas dissolution in drilling mud. (dissolving−$\dot{m}$ is positive, releasing−$\dot{m}$ is negative)

$\dot{m}$ is related to gas solubility $Rs$, flow rate gas density, current dissolved gas etc.

In some embodiments, in order to estimate the maximum pressure and maximum flowrate, the simulator calculates profiles of pressure and flow rate to determine the maximum pressure and maximum flowrate (see block 220). In embodiments, the simulator may calculate the pressure profile at the surface of the well and/or at the casing boot of the well, and may calculate the flowrate of gas and liquid. The maximum pressure and maximum flowrate may be extracted from the pressure profiles (see block 225), and may then be compared to the equipment limits for the MPD system 10 (see decision block 227) to determine whether the influx can be safely circulated (for example under the current conditions). For example, the influx may be capable of being circulated out of the MPD system 10 if the maximum pressure and maximum flowrate are both less than the equipment limits. In some embodiments, the equipment limit relating to pressure may include the pressure limit of a casing shoe of the well and/or the pressure limit of the RCD 22 of the MPD system 10. Typically, the casing shoe may be the weak point of the MPD system 10, so if the influx is below the casing shoe, the pressure limit of the casing shoe may serve as the pressure limit for comparison. If or when the influx is disposed above the casing shoe, the pressure limit of the RCD 22 may serve as the pressure limit for comparison in some embodiments. In some embodiments, the equipment limit relating to flowrate may include the flowrate limit of the gas separator of the MPD system 10. In some embodiments, the gas separator may be a two-phase separator, while in other embodiments, the gas separator may be a three-phase separator.

In embodiments, the simulation and comparison to determine the possibility of circulation of the influx (e.g. the evaluation) may occur in real-time (e.g. within seconds). For example, the process may take less than about 90 seconds (e.g. 5-90, 10-90, 30-90, 60-90, 5-60, 10-60, 30-60, 45-60, 5-45, 10-45, 20-45, 30-45, 5-30, 10-30, 20-30, 5-20, 10-20, or 5-10 seconds). Based on the comparison/evaluation (at decision block 227), either the circulation process (see block 260) or shut-in process (see block 250) may be initiated. For example, if the circulation process can be safely implemented (e.g. because the maximum pressure and maximum flowrate are both below the relevant equipment limits, based on the evaluation), in some embodiments influx circulation may occur, for example based on the evaluated pressure and flowrate (e.g. at the maximum flowrate). If the circulation process cannot safely be implemented (e.g. because one or both of the maximum pressure and maximum flowrate are above the relevant equipment limits, based on the evaluation), in some embodiments well shut-in may be initiated. In some embodiments, an alarm may be activated and/or shut-in may be initiated (for example automatically in some embodiments) in the event that the influx is too large to safely be circulated. In some embodiments, based on the comparison/evaluation (at decision block 227), results may be sent to an operator (who may then control the MPD system 10 accordingly). In some embodiments, the control system 100 may auto control the circulation process (e.g. automatically controlling the MPD system 10 to safely circulate fluid out of the MPD system 10 based on the comparison (e.g. block 227).

In some embodiments, the control system 100 may estimate (e.g. based on assuming that the influx is at the bottom of the well initially) or further receive data regarding the location of the influx in the well (e.g. relative to the casing shoe). For example, one or more sensors may be used to detect the location of the influx (and send that data to the control system 100), or sensor data may be used by the control system 100 to estimate influx location within the wellbore 12. Influx location may be useful since, as noted above, the casing shoe may be the weak point in some MPD systems 10. For such systems, it may be possible to change the flowrate once the influx is above the casing shoe (e.g. with the influx located between the RCD 22 and the casing shoe). For example, initially the flow rate used while the influx is below the casing shoe may be the initial flow rate; but once the influx moves to be located above the casing shoe, the flow rate may be set based on the simulation (e.g. while keeping both flowrate and pressure below equipment limits and/or preventing additional influx).

Some embodiments may include optional optimization of the circulation process, as shown for example in FIG. 2. For example, the control system 100 may use the simulator (e.g. which may be the same simulator previously used or, in some embodiments, may be a different simulator) to determine an optimized fluid circulation process. In some embodiments, optimization may occur in the event that the comparison (e.g. at block 227) indicates that circulation is not safe (e.g. that the max pressure and/or flowrate exceeds equipment limits), in an attempt to determine if there is some combination of flowrate and pressure which will be effective to safely circulate the influx (see block 230). Optimization may lead to a new maximum pressure and maximum flowrate (see block 232), which may then be compared to the equipment limits (see decision block 237). If either the max pressure or max flowrate after optimization exceeds the corresponding equipment limits, then well shut-in may be initiated (see block 250). Otherwise, influx circulation may be initiated (see block 260), for example based on the updated pressure and flowrate. In some embodiments, optimization may be used even if the comparison (e.g. at block 227) indicates that circulation can be safely performed, for example in an attempt to optimize the circulation process (see block 240). For example, optimization may find a way to increase the flowrate while safely circulating the influx, providing benefit to the MPD system 10 (such as minimizing non-productive time). Typically, the optimization processes at block 240 and block 230 may be substantially the same, although in other embodiments, different simulator models could be used. In the event that an optimized circulation process can be determined (at block 240), this may result in better performance and/or higher reliability of the MPD system 10 (see block 242), and influx circulation may be initiated accordingly (see block 260).

In embodiments, the control system 100 may iteratively use the simulator to determine the optimized circulation process, and responsive to determining the optimized circulation process, may initiate an action (e.g. circulating fluid out or initiating shut-in) in the MPD system 10 based on the optimized circulation process. In embodiments, the simulator may iteratively use a multi-phase flow model (which may be a transient multi-phase flow model in some embodiments). For example, the simulator may use a Drift Flux Model (DFM). In some embodiments, iteratively using the simulator may comprise running the simulator a plurality of times, for example within a pre-set timeframe. For example, the pre-set timeframe may be less than 90 seconds (e.g. 5-90, 10-90, 30-90, 60-90, 5-60, 10-60, 30-60, 45-60, 5-45, 10-45, 20-45, 30-45, 5-30, 10-30, 20-30, 5-20, 10-20, or 5-10 seconds), effectively allowing optimization in real-time.

In some embodiments, the control system may repeatedly run the simulator, each time with adjusted parameters, to calculate an array of modeled pressure and flowrate pairings, which can then be compared to the equipment limits, to determine the optimized circulation process. In some embodiments, adjusting the parameters for different iterations with the simulator may comprise selecting different values for one or more parameter in proximity to a measured/sensed value from the MPD system 10 and/or within a range. In some embodiments, flow rate may be varied within the range (e.g. by a pre-set step size, such as 10 gal/min), and SBP may be calculated therefrom (e.g. with an increase in flow rate reducing the SBP for maintaining the required (e.g. constant) BHP, while a decrease in flow rate leads to increased SBP). For example, for flow rate the parameter may range from the original flow rate to half of the original flow rate. In some embodiments, adjusting the flowrate parameter for different iterations with the simulator may comprise iteratively moving the flow rate lower (e.g. from the original flow rate) by pre-set steps (e.g. approximately 10 gal/min) within the range, such as from the original flow rate down to half of the original flow rate. In some embodiments, adjusting the parameters for different iterations with the simulator may comprise iteratively moving parameters farther from the measured/sensed value from the MPD system 10. In some embodiments, the control system 100 may select the optimized circulation process from the array, for example based on maximizing flowrate while maintaining the pressure and flowrate below the equipment limits (while neutralizing the influx).

In some embodiments, the flow rate may change (e.g. by altered) based on location of the influx with respect to the casing shoe. For example, below the casing shoe, the flow rate may be the initial flow rate, while the flow rate determined by the simulator (e.g. to safely circulate the influx and/or the optimized flow rate) may be used above the casing shoe. In some embodiments, the control system 100 may be configured to automatically control the MPD system 10 to circulate fluid based on the optimized circulation process. Regardless of whether optimization is used (as in FIG. 2) or not, once the influx has been circulated out of the MPD system 10 (see box 260), drilling may be resumed.

The exemplary method set forth in FIG. 2 may be thought of as including one or more sub-methods, each of which can be used individually or in combination to improve the MPD system 10. By way of example, the use of the simulator to determine maximum pressure and flow rate for comparison to the equipment limits may be used in conjunction with the use of the simulator to optimize the circulation process, or it may be used without such optimization. In some embodiments, optimization using the simulator (e.g. iteratively) may be used with other processes, such as other evaluation techniques. It should be understood that such examples are merely illustrative and are not limiting, and that the particular combination of steps in FIG. 2 illustrates a particular embodiment which is fairly complete, and in doing so also serves to effectively illustrate sub-methods therein.

Disclosed embodiments also include an exemplary system 200 (e.g. which may have associated exemplary subsystems) which may be configured to implement influx detection and mitigation methods, such as described with respect to FIG. 2. For example, the system/method 200 shown in FIG. 2 may be implemented by the control system 100, which may receive sensor data from the MPD system 10, use the sensor data (e.g. using a method similar to that described with respect to FIG. 2), and in some instances alert/signal or take automatic action based on the evaluation/comparison results (e.g. at box 227).

For example, the step(s) relating to detecting, confirming, and neutralizing an influx can be performed by subsystem **200*a*. The step(s) related to evaluating whether the detected influx can be safely circulated by the MPD system 10 can be performed by subsystem 200*b*. The step(s) related to optimizing the circulation process can be performed by subsystem 200*c*. While FIG. 2 illustrates a number of the subsystems/processes being used together to improve the MPD system 10, in some embodiments only one or more of the subsystems may be used (e.g. as run by control system 100) as part of the MPD system 10. For example, subsystem 200*a* and 200*b* may be used together in some embodiments without optimization in subsystem 200*c*. In some embodiments, optimization subsystem 200*c* may be used independently of evaluation subsystem 200*b***, for example being used with one or more other processes/sub-systems.

If an influx is detected, one or more actions may be taken in response to the detection. If evaluation determines that circulation may not safely occur, one or more actions may be taken in response to that evaluation. For example, an alarm or other notification to rig personnel may be activated. In some instances, the alarm or notification may communicate whether mitigation may occur or whether shut-in procedures should be employed (for example, depending on the size of the influx detected). In some instances, options for action may be provided to an operator. In some instances, back-pressure may be adjusted (e.g. increased) to address a detected influx (e.g. using the choke manifold 32 and/or the back-pressure pump 75). In some embodiments, the MPD system 10 may be adjusted based on the evaluation or optimization, to provide effective circulation. Personnel/operators at the rig/well may take actions as necessary or advisable based on the information provided by the control system 100 regarding the MPD system 10. In some embodiments, corrective actions/adjustments may be automatically employed, for example with the control system 100 automatically controlling one or more elements of the MPD system 10. In some embodiments, a machine learning model can be used, for example to continually update and refine the method/system and/or to automatically signal/alarm influx and/or automatically take corrective action (e.g. shut-in or circulation).

Additional Disclosure

The following are non-limiting, specific embodiments in accordance with the present disclosure:

In a first embodiment, a method for drilling a well using an MPD system, comprises: responsive to detection (and typically confirmation) of an influx in the MPD system, receiving (for example, at a control system) data regarding the size (e.g. volume) and duration of the detected influx; receiving (for example, at the control system) data regarding one or more operational parameter of the MPD system (e.g. such as bit depth, mud properties (viscosity, density), flow rate, post-influx SBP, etc.) (and in some embodiments also data regarding the well configuration, such as annulus ID, drillstring OD, well survey-temperature, inclination, etc.); using (e.g. via the control system) a simulator to estimate (e.g. via calculation) a maximum pressure and maximum flowrate during influx circulation for the MPD system based on current conditions in the MPD system (e.g. the parameter data); and comparing (e.g. via the control system) the maximum pressure and maximum flowrate to equipment limits of the MPD system (e.g. the limits of casing shoe and RCD for pressure and the gas separator for flow rate); wherein the influx can be circulated out with the MPD system without the need for a shut-in process if the maximum pressure and maximum flowrate are both less than the equipment limits.

A second embodiment can include the method of the first embodiment, further comprising: drilling a wellbore, including flowing fluid through the wellbore (e.g. down through the drillstring and then up in the annulus) during drilling; monitoring, using one or more sensors, one or more operational parameters associated with drilling the wellbore; and responsive to comparing the maximum pressure and maximum flowrate to the equipment limits, initiating an action in the MPD system.

A third embodiment can include the method of the first or second embodiment, wherein the simulator uses a multi-phase flow model, which may be a transient multi-phase flow model in some embodiments.

A fourth embodiment can include the method of any one of the first to third embodiments, wherein the simulator uses a Drift Flux Model (DFM).

A fifth embodiment can include the method of the third or fourth embodiment, wherein the model considers mass conservation of the gas and liquid phases separately, and accounts for the interaction between the two phases using a mixture momentum equation (e.g. counting interactions between the two phases with a mixture momentum equation) (e.g. the model may use two mass conservation equations, for the gas and liquid, plus a mixture momentum equation).

A sixth embodiment can include the method of any one of the third to fifth embodiments, wherein the model calculates liquid and gas flowrates.

A seventh embodiment can include the method of any one of the third to sixth embodiments, wherein the model considers (e.g. takes into account) gas solubility.

An eighth embodiment can include the method of any one of the third to seventh embodiments, wherein the simulator is effective for both water-based mud (WBM) and oil-based mud (OBM), further comprising selecting the model for the simulator based on mud type.

A ninth embodiment can include the method of any one of the first to eighth embodiments, wherein using a simulator to estimate the maximum pressure and maximum flowrate comprises calculating profiles of pressure and flow rate to determine (e.g. by extracting from the profiles) the maximum pressure and maximum flowrate.

A tenth embodiment can include the method of the ninth embodiment, wherein the simulator calculates the pressure profile at the surface of the well and at the casing shoe of the well, and calculates the flowrate of gas and liquid.

An eleventh embodiment can include the method of any one of the first to tenth embodiments, wherein estimating and comparing occurs in real-time (e.g. in seconds). For example, estimating and comparing may take less than about 90 seconds (e.g. 5-90, 10-90, 30-90, 60-90, 5-60, 10-60, 30-60, 45-60, 5-45, 10-45, 20-45, 30-45, 5-30, 10-30, 20-30, 5-20, 10-20, or 5-10 seconds).

A twelfth embodiment can include the method of any one of the first to eleventh embodiments, further comprising initiating circulation process or shut-in process based on the comparison (e.g. of the max pressure and flowrate to equipment limits).

A thirteenth embodiment can include the method of any one of the first to twelfth embodiments, wherein one or more sensors provides the parameter data to the control system/unit.

A fourteenth embodiment can include the method of any one of the first to thirteenth embodiments, further comprising activating an alarm and/or initiating shut-in in the event that the influx is too large to safely be circulated.

A fifteenth embodiment can include the method of any one of the first to fourteenth embodiments, further comprising outputting results (e.g. based on the comparison and whether it indicates that circulation can safely be performed, and if so, at what pressure and flowrate) to an operator (who may then control the MPD system accordingly).

A sixteenth embodiment can include the method of any one of the first to fourteenth embodiments, further comprising auto controlling the circulation process (e.g. automatically controlling the MPD system, via the control system, to (safely) circulate fluid (out of and/or using the MPD system) based on the simulator/model.

A seventeenth embodiment can include the method of any one of the first to sixteenth embodiments, further comprising estimating the location of the influx (e.g. assuming that the influx initially occurs at the bottom of the well and then estimating the position of the influx therefrom) or receiving data regarding location of the influx in the well (e.g. relative to the casing shoe) (e.g. detecting or estimating, based on one or more sensor, the location of the influx, and transmitting the location data to the control system).

An eighteenth embodiment can include the method of the seventeenth embodiment, wherein the flow rate below the casing shoe is different than the flow rate above the casing shoe (e.g. the original flow rate is used below the casing shoe, and the flowrate from the simulation is used above the casing shoe).

A nineteenth embodiment can include the method of any one of the first to eighteenth embodiments, further comprising using the simulator (e.g. which may be the same simulator previously used or, in some embodiments, could be a different simulator) to determine an optimized fluid circulation process.

A twentieth embodiment can include the method of the nineteenth embodiment, wherein determining an optimized fluid circulation process in an MPD drilling system, comprises: iteratively using the simulator to determine an optimized circulation process (e.g. running a plurality of simulations); and responsive to determining the optimized circulation process, initiating an action (e.g. circulating fluid out of) in the MPD system based on the optimized circulation process.

A twenty-first embodiment can include the method of the twentieth embodiment, wherein iteratively using the simulator comprises repeatedly running the simulator, each time with adjusted parameters, to calculate an array of modeled pressure and flowrate pairings; and comparing the array to the equipment limits to determine the optimized circulation process.

A twenty-second embodiment can include the method of the twenty-first embodiment, further comprising selecting the optimized circulation process from the array based on maximizing flowrate while maintaining the pressure and flowrate below the equipment limits (and preventing additional influx).

A twenty-third embodiment can include the method of the twentieth embodiment, wherein iteratively using the simulator comprises introducing a different flow rate each iteration (e.g. steps, for example of approximately 10 gal/min, of flow rate for each iteration within a range (e.g. between the original flow rate and half the original flow rate)).

A twenty-fourth embodiment can include the method of the twenty-third embodiment, further comprising selecting the optimized circulation process from the iterative flowrate results based on maximizing flowrate while maintaining the pressure and flowrate below the equipment limits (without introducing new influx) (e.g. maintaining approximately constant BHP while ensuring that the flow rate and pressure do not exceed the equipment limits).

A twenty-fifth embodiment can include the method of any one of the first to twenty-fourth embodiments, further comprising: detecting influx in the MPD drilling system and adjusting SBP to control influx; and responsive to detecting influx, stopping drilling.

A twenty-sixth embodiment can include the method of any one of the first to twenty-fifth embodiments, further comprising, responsive to circulating (e.g. fluid out of the MPD drilling system), resuming drilling.

In a twenty-seventh embodiment, a method for drilling a well using an MPD system, comprises: receiving data (e.g. at a processor) regarding one or more parameter of the MPD system (e.g, wherein the one or more parameter of the MPD system are selected from the following: influx size (e.g. volume) and duration, operational parameters of the MPD drilling system (e.g. such as bit depth, mud properties (e.g. viscosity, density), flow rate, post-influx SBP, etc.), well configuration data (such as annulus ID, drillstring OD, well survey-temperature, inclination, etc.); iteratively using (e.g. via a processor) a simulator to determine an optimized circulation process; and responsive to determining the optimized circulation process, initiating an action (e.g. circulating fluid out) in the MPD system based on the optimized circulation process.

A twenty-eighth embodiment can include the method of the twenty-seventh embodiment, wherein the simulator uses a multi-phase flow model (which may be a transient multi-phase flow model in some embodiments).

A twenty-ninth embodiment can include the method of the twenty-seventh or twenty-eighth embodiment, wherein the simulator uses a Drift Flux Model (DFM).

A thirtieth embodiment can include the method of the twenty-eighth or twenty-ninth embodiment, wherein the model considers (e.g. takes into account) mass conservation of gas-liquid two phase separately and counts interactions between the two phases with a mixture momentum equation (e.g. the model uses two mass conservation equations, for the gas and liquid, plus a mixture momentum equation.).

A thirty-first embodiment can include the method of any one of the twenty-eighth to thirtieth embodiments, wherein the model calculates liquid and gas flowrates.

A thirty-second embodiment can include the method of any one of the twenty-eighth to thirty-first embodiments, wherein the model considers (e.g. takes into account) gas solubility.

A thirty-third embodiment can include the method of any one of the twenty-eighth to thirty-second embodiments, wherein the simulator works for both WBM and OBM, further comprising selecting the model based on mud type.

A thirty-fourth embodiment can include the method of any one of the twenty-seventh to thirty-third embodiments, wherein the simulator calculates the pressure profile at the surface of the well and at the casing shoe of the well, and calculates the flowrate of the gas and the liquid.

A thirty-fifth embodiment can include the method of any one of the twenty-seventh to thirty-fourth embodiments, wherein determining an optimized circulation process (e.g. calculating and comparing) occurs in real-time (e.g. in seconds-such as less than about 90 seconds (e.g. 5-90, 10-90, 30-90, 60-90, 5-60, 10-60, 30-60, 45-60, 5-45, 10-45, 20-45, 30-45, 5-30, 10-30, 20-30, 5-20, 10-20, or 5-10 seconds)).

A thirty-sixth embodiment can include the method of any one of the twenty-seventh to thirty-fifth embodiments, further comprising auto controlling the circulation process (e.g. automatically controlling, by the processor, the MPD system to circulate fluid based on the optimized circulation process).

A thirty-seventh embodiment can include the method of any one of the twenty-seventh to thirty-sixth embodiments, wherein iteratively using the simulator comprises repeatedly running the simulator, each time with adjusted parameters, to calculate an array of modeled pressure and flowrate pairings; and comparing the array to the equipment limits to determine the optimized circulation process.

A thirty-eighth embodiment can include the method of any one of the twenty-seventh to thirty-seventh embodiments, wherein one or more sensors provides parameter data to the processor.

A thirty-ninth embodiment can include the method of any one of the thirty-seventh to thirty-eighth embodiments, wherein adjusting the parameters for different iterations with the simulator comprises selecting different values for each parameter in proximity to the measured/sensed value from the MPD system.

A fortieth embodiment can include the method of any one of the thirty-seventh to thirty-eighth embodiments, wherein adjusting the parameters for different iterations with the simulator comprises iteratively moving parameters farther from the measured/sensed value from the MPD system.

A forty-first embodiment can include the method of any one of the twenty-seventh to fortieth embodiments, wherein iteratively using the simulator comprises running the simulator a plurality of times within a pre-set timeframe.

A forty-second embodiment can include the method of the forty-first embodiment, wherein the pre-set timeframe is less than 90 seconds (e.g. 5-90, 10-90, 30-90, 60-90, 5-60, 10-60, 30-60, 45-60, 5-45, 10-45, 20-45, 30-45, 5-30, 10-30, 20-30, 5-20, 10-20, or 5-10 seconds).

A forty-third embodiment can include the method of any one of the thirty-seventh to forty-second embodiments, further comprising selecting the optimized circulation process from the array based on maximizing flowrate while maintaining the pressure and flowrate below the equipment limits (e.g. and not introducing new influx).

A forty-fourth embodiment can include the method of any one of the twenty-seventh to forty-third embodiments, wherein iteratively using the simulator comprises introducing a different flow rate each iteration (e.g. steps (e.g. sized approximately 10 gal/min) of flow rate for each iteration within a range (e.g. between the original flow rate and half the original flow rate),).

A forty-fifth embodiment can include the method of the forty-fourth embodiment, further comprising selecting the optimized circulation process from the iterative flowrate results based on maximizing flowrate while maintaining the maximum pressure and maximum gas/liquid flowrate below the equipment limits (e.g. and not introducing new influx).

A forty-sixth embodiment can include the method of any one of the twenty-seventh to forty-fifth embodiments, further comprising estimating or receiving data regarding location of the influx in the well (e.g. relative to the casing shoe).

A forty-seventh embodiment can include the method of the forty-sixth embodiment, wherein the flow rate below the casing shoe is different than the flow rate above the casing shoe (e.g. the original flow rate is used below the casing shoe, and the flowrate from the simulation and/or optimization is used above the casing shoe).

A forty-eighth embodiment can include the method of any one of the twenty-seventh to forty-seventh embodiments, further comprising: detecting influx in the MPD system, and responsive to detecting influx, stopping drilling.

A forty-ninth embodiment can include the method of the forty-eighth embodiment, further comprising adjusting SBP to control influx.

A fiftieth embodiment can include the method of any one of the twenty-seventh to forty-ninth embodiments, further comprising, responsive to circulating (e.g. fluid using the MPD system), resuming drilling (e.g. with the MPD system).

In a fifty-first embodiment, a programmable storage device having program instructions stored thereon for causing a processor to perform the method according to any one of the first to fiftieth embodiments.

In a fifty-second embodiment, a non-transitory computer-readable medium having program instructions stored thereon for causing a control system to perform the method according to any one of the first to fiftieth embodiments.

In a fifty-third embodiment, an MPD system for drilling a wellbore comprising: a drillstring disposed in the wellbore; an RCD configured to seal an annulus of the wellbore (e.g. around the drillstring); a choke manifold in fluid communication with the annulus; a mud pump in fluid communication with the choke manifold and the drillstring; a drilling fluid handling system, including a gas separator (and in some embodiments, one or more mud pit) (which may be in fluid communication with both the choke manifold and the mud pump); one or more sensors configured to sense one or more of the following parameters: influx size (e.g. volume) and duration, operational parameters of the MPD drilling system (e.g. such as bit depth, mud properties (e.g. viscosity and density), flow rate, post-influx SBP, etc.), well configuration data (such as annulus ID, drillstring OD, well survey data-temperature, inclination, etc.); and a control system configured to implement the method of any one of the first to fiftieth embodiments.

A fifty-fourth embodiment can include the system of the fifty-third embodiment, wherein the control system comprises or uses the programmable storage device of the fifty-first embodiment or the non-transitory computer-readable medium of the fifty-second embodiment.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. For example, the various elements or components may be combined or integrated in another system or certain features may be omitted or not implemented. Also, techniques, systems, subsystems, and methods described and illustrated in the various embodiments as discrete or separate may be combined or integrated with other techniques, systems, subsystems, or methods without departing from the scope of this disclosure. Other items shown or discussed as directly coupled or connected or communicating with each other may be indirectly coupled, connected, or communicated with. Method or process steps set forth may be performed in a different order. The use of terms, such as "first," "second," "third" or "fourth" to describe various processes or structures is only used as a shorthand reference to such steps/structures and does not necessarily imply that such steps/structures are performed/formed in that ordered sequence (unless such requirement is clearly stated explicitly in the specification).

Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: $R=Rl+k*(Ru-Rl)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Language of degree used herein, such as "approximately," "about," "generally," and "substantially," represent a value, amount, or characteristic close to the stated value, amount, or characteristic that still performs a desired function or achieves a desired result. For example, the language of degree may mean a range of values as understood by a person of skill or, otherwise, an amount that is +/−10%.

Use of broader terms such as comprises, includes, having, etc. should be understood to provide support for narrower terms such as consisting of, consisting essentially of, comprised substantially of, etc. When a feature is described as "optional," both embodiments with this feature and embodiments without this feature are disclosed. Similarly, the present disclosure contemplates embodiments where this "optional" feature is required and embodiments where this feature is specifically excluded. The use of terms such as "high-pressure" and "low-pressure" is intended to only be descriptive of the component and their position within the systems disclosed herein. That is, the use of such terms should not be understood to imply that there is a specific operating pressure or pressure rating for such components. For example, the term "high-pressure" describing a manifold should be understood to refer to a manifold that receives pressurized fluid that has been discharged from a pump irrespective of the actual pressure of the fluid as it leaves the pump or enters the manifold. Similarly, the term "low-pressure" describing a manifold should be understood to refer to a manifold that receives fluid and supplies that fluid to the suction side of the pump irrespective of the actual pressure of the fluid within the low-pressure manifold.

Accordingly, the scope of protection is not limited by the description set out above but is only limited by the claims which follow, that scope including all equivalents of the subject matter of the claims. Each and every claim is incorporated into the specification as embodiments of the present disclosure. Thus, the claims are a further description and are an addition to the embodiments of the present disclosure. The discussion of a reference herein is not an admission that it is prior art, especially any reference that can have a publication date after the priority date of this application. The disclosures of all patents, patent applications, and publications cited herein are hereby incorporated by reference, to the extent that they provide exemplary, procedural, or other details supplementary to those set forth herein.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

As used herein, the term "or" is inclusive unless otherwise explicitly noted. Thus, the phrase "at least one of A, B, or C"

is satisfied by any element from the set {A, B, C} or any combination thereof, including multiples of any element.

As used herein, the term "and/or" includes any combination of the elements associated with the "and/or" term. Thus, the phrase "A, B, and/or C" includes any of A alone, B alone, C alone, A and B together, B and C together, A and C together, or A, B, and C together.

The invention claimed is:

1. A method for drilling a well using a managed pressure drilling (MPD) system, comprising:

drilling a wellbore using the MPD system;

monitoring, using one or more sensors, one or more operational parameters associated with drilling the wellbore;

detecting an influx in the MPD system;

neutralizing the influx within the MPD system;

responsive to detection of the influx in the MPD system, receiving, at a control system, data regarding size and duration of the detected influx;

receiving, at the control system, data regarding the one or more operational parameters associated with drilling the wellbore;

responsive to detection and neutralization of the influx in the MPD system, using, via the control system, a simulator to estimate in real-time a maximum pressure and a maximum flowrate for the MPD system using the received data;

comparing, via the control system, the maximum pressure to a pressure equipment limit of the MPD system and the maximum flowrate to a flowrate equipment limits of the MPD system; and responsive to comparing the maximum pressure and the maximum flowrate to the respective equipment limits and determining that both are less than the respective equipment limits, initiating circulation of the influx through an action in the MPD system;

wherein the influx can be circulated out with the MPD system without a shut-in process if the maximum pressure and the maximum flowrate are both less than the respective equipment limits, and wherein the simulator uses a multi-phase flow model, and the model considers mass conservation of the gas and liquid phases separately and uses a mixture momentum equation.

2. The method of claim 1, wherein the simulator uses a Drift Flux Model (DFM).

3. A MPD system for drilling a wellbore comprising:

a drillstring disposed in the wellbore;

a rotating control device (RCD) configured to seal an annulus of the wellbore;

a choke manifold in fluid communication with the annulus;

a mud pump in fluid communication with the choke manifold and the drillstring;

a drilling fluid handling system, including a gas separator;

one or more sensors configured to sense one or more of the following parameters: influx size, influx duration, drill bit depth, mud viscosity, mud density, flow rate, post-influx SBP, well temperature, and well inclination; and a control system configured to implement the method of claim 2.

4. The method of claim 1, wherein the simulator is effective for both water-based mud (WBM) and oil-based mud (OBM), further comprising selecting the model for the simulator based on mud type.

5. The method of claim 1, wherein using the simulator to estimate the maximum pressure and maximum flowrate comprises calculating profiles of pressure and flow rate to determine the maximum pressure and maximum flowrate.

6. The method of claim 1, wherein the one or more operational parameters associated with drilling the wellbore are selected from the following: bit depth, mud viscosity, mud density, flow rate, and post-influx surface backpressure (SBP); and wherein the simulator further uses data regarding the well configuration comprising at least one selected from the following: wellbore diameter, drillstring outer diameter, well temperature, and well inclination.

7. The method of claim 1, wherein the equipment limits of the MPD drilling system comprise a pressure limit of a casing shoe, a pressure limit of a rotating control device (RCD), and a flowrate limit of a gas separator.

8. The method of claim 1, further comprising:

using the simulator to determine an optimized fluid circulation process, wherein determining an optimized fluid circulation process comprises:

iteratively using the simulator to determine the optimized circulation process; and responsive to determining the optimized circulation process, initiating a circulation process in the MPD system based on the optimized circulation process.

9. The method of claim 8, further comprising:

automatically controlling, by the processor, the MPD system to circulate fluid based on the optimized circulation process; and responsive to circulating fluid, resuming drilling.

10. The method of claim 8, wherein iteratively using the simulator comprises introducing a different flow rate each iteration.

11. The method of claim 10, further comprising selecting the optimized circulation process based on maximizing flowrate while maintaining pressure and flowrate below equipment limits.

12. The method of claim 8, wherein iteratively using the simulator comprises running the simulator a plurality of times within a pre-set timeframe which is less than 90 seconds.

13. The method of claim 8, wherein using the simulator to determine the optimized fluid circulation process further comprises:

using the simulator in a first optimization mode to determine that at least one of the maximum pressure and the maximum flowrate exceeds a corresponding equipment limit of the MPD system, the first optimization mode comprising iteratively using the simulator to determine whether any combination of flow rate and surface backpressure (SBP) allows the influx to be safely circulated without exceeding the corresponding equipment limits of the MPD system; and responsive to determining that at least one of the maximum pressure and the maximum gas flowrate exceeds a corresponding equipment limit, initiating shut-in; and using the simulator in a second optimization mode responsive to determining that both the maximum pressure and the maximum gas flowrate are less than the corresponding equipment limits of the MPD system, the second optimization mode comprising iteratively using the simulator to determine a circulation process that maximizes flow rate while maintaining the maximum pressure and maximum gas flowrate below the corresponding equipment limits.

14. The method of claim 1, further comprising:

evaluating whether the size of the detected influx exceeds a pre-set large influx size limit and the surface back-pressure (SBP) of the MPD system exceeds a pre-set SBP limit; and responsive to determining that both the influx size and SBP exceed the respective limits, immediately initiating well shut-in without initiating influx neutralization and/or simulation.

15. The method of claim 1, wherein the simulator calculates a pressure profile at the surface of the well and a pressure profile at a casing shoe of the well, and calculates a flow rate of both gas and liquid.

16. The method of claim 15, further comprising estimating a location of the detected influx, wherein the pressure equipment limit for comparison is that of the casing shoe of the well when the influx is located below the casing shoe, and wherein the pressure equipment limit for comparison is that of a rotating control device (RCD) of the well when the influx is located above the casing shoe.

17. The method of claim 1, further comprising estimating a location of the detected influx, and using the MPD system to change the flowrate once the influx is above a casing shoe of the well.

18. The method of claim 1, wherein responsive to comparing the maximum pressure and the maximum flowrate to the respective equipment limits and determining that at least one is greater than the respective equipment limits, initiating a shut-in procedure for the well.

19. The method of claim 1, wherein responsive to comparing the maximum pressure and the maximum flowrate to the respective equipment limits and determining that at least one is greater than the respective equipment limits, using the simulator to determine an optimized circulation process with a new maximum pressure and a new maximum flowrate, and comparing the new maximum pressure and the new maximum flowrate to the respective equipment limits, wherein if either the new maximum pressure or the new maximum flowrate exceeds the equipment limits, well shut-in is initiated; and if both the new maximum pressure or the new maximum flowrate do not exceed the equipment limits, circulating the influx based on the new pressure and new flowrate.

20. The method of claim 1, wherein initiating circulation of the influx in response to determining that both the maximum pressure and the maximum flowrate are less than the respective equipment limits further comprises using the simulator to determine an optimized circulation process with a new maximum pressure and a new maximum flowrate and circulating the influx based on the new pressure and new flowrate to increase flowrate.

* * * * *